United States Patent [19]

Ammann et al.

[11] Patent Number: 4,793,052
[45] Date of Patent: Dec. 27, 1988

[54] METHOD FOR POSITIONING A PANEL

[75] Inventors: Hans H. Ammann, Chester; Richard F. Kovacs, Hanover Township, Morris County, both of N.J.

[73] Assignee: American Telephone and Telegraph Company, AT&T Laboratories, Murray Hill, N.J.

[21] Appl. No.: 119,941

[22] Filed: Nov. 13, 1987

[51] Int. Cl.$^4$ .............................................. B23Q 7/00
[52] U.S. Cl. ....................................... 29/559; 414/749
[58] Field of Search ............... 29/557, 559, 26 A; 269/109, 110, 112, 117, 42; 414/749, 754; 279/1 L; 409/218, 219, 225

[56] References Cited

U.S. PATENT DOCUMENTS

| | | | |
|---|---|---|---|
| 840,777 | 1/1907 | Lawson | 269/109 X |
| 1,966,338 | 7/1934 | Eggimann | 269/109 X |
| 3,550,245 | 12/1970 | Davis | 29/559 X |
| 4,092,783 | 6/1978 | Hodges | 33/180 R |
| 4,143,868 | 3/1979 | Bergman | 29/559 X |
| 4,168,825 | 9/1979 | Primmer | 269/42 |
| 4,201,374 | 5/1980 | Gras | 269/37 |
| 4,255,077 | 3/1981 | Smith | 414/786 |
| 4,336,926 | 6/1982 | Inagaki et al. | 269/34 |
| 4,407,627 | 10/1983 | Sato et al. | 414/754 |
| 4,425,076 | 1/1984 | Colineau | 414/781 |
| 4,527,784 | 7/1985 | Schwab | 269/109 X |
| 4,573,406 | 3/1986 | Cleemput et al. | 101/127.1 |
| 4,688,321 | 8/1987 | Smith | 24/559 |

FOREIGN PATENT DOCUMENTS

| | | | |
|---|---|---|---|
| 211432 | 7/1909 | Fed. Rep. of Germany | 269/109 |
| 14277 | 2/1977 | Japan | 29/559 |
| 650769 | 3/1979 | U.S.S.R. | 29/559 |

Primary Examiner—William R. Briggs
Attorney, Agent, or Firm—Alfred G. Steinmetz

[57] ABSTRACT

A panel locating method engages holes in a panel which are located in the panel symmetrically about a fixed point and axis and applies synchronized opposing displacements of engaging elements to locate and secure the panel on a work surface.

19 Claims, 5 Drawing Sheets

METHOD FOR POSITIONING A PANEL

FIELD OF THE INVENTION

This invention relates to a method and apparatus for the positioning of panels on a work surface in register with a reference coordinate system to permit operations to be accurately performed on the panel.

BACKGROUND OF THE INVENTION

In the production of panels, many manufacturing processes are performed at different work stations. To assure that these operations produce results which are precise with respect to the panel and to each other, the panel must be precisely positioned with respect to a reference coordinate system at each work station. Methods and apparatus to accomplish panel positioning must be consistently precise and also accommodate and minimize the effects of dimensional variations that occur in the panel during manufacture due to expansion, contraction, shear and other material instabilities.

Figure 1:
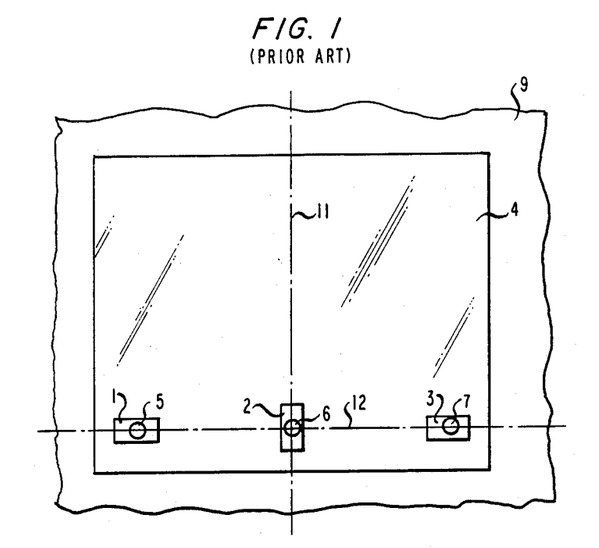
FIG. 1 is a schematic representation of a panel positioning scheme of the prior art using slots cut into the panel and locating pins on the work surface and discussed herein above.
Figure 2:
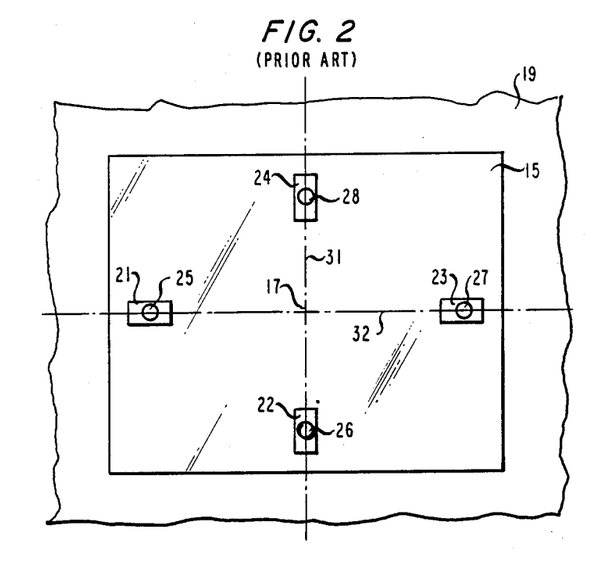
FIG. 2 is a schematic representation of another panel positioning scheme of the prior art using slots cut into the panel and locating pins on the work surface and discussed here above.

One class of existing techniques of aligning a panel with a work surface reference frame utilizes a plurality of slots cut into the panel which fit over locating pins located on the work surface at each work station. Two ways of implementing this technique are shown in FIGS. 1 and 2, respectively. In FIG. 1 locating slots 1, 2 and 3 are cut into panel 4. Slots 1, 2 and 3 fit over pins 5, 6 and 7 of the work surface 9 (shown in fragmented form). The two horizontal slots 1 and 3 control the vertical positioning and angular positioning of the panel, and the vertical slot 2 controls its horizontal positioning. Since slots 1, 2 and 3 are all located along one edge of panel 4, it is apparent that the panel reference frame is along that edge as shown by axes 11 and 12 with the origin located within slot 2. The axis 12 is a fixed axis which goes through a fixed point determined by pin 6.

It is preferable to have the reference frame origin at the center of the panel to minimize worst case registration errors that result from linear deformations of the panel that occur during its manufacturing processing. One technique of moving the reference frame origin to the center of the panel is to utilize slots located along all four edges, as disclosed in FIG. 2. Four slots 21, 22, 23 and 24 are located at the center of each edge of the panel 15. Slots 21, 22, 23 and 24 are positioned over pins 25, 26, 27 and 28 to locate the panel on a work surface 19. As shown in FIG. 2, the reference frame origin 17 is at the center of the panel and defined by the two intersecting axes 31 and 32. Hence, changes in linear dimensions of the panel are minimized in both orthogonal directions of the reference frame. However, shear deformation of the panel is not accommodated by this technique.

Another method of positioning panels on a work surface in register with a reference coordinate system utilizes locator devices which engage V shaped slots cut in the center of each of three edges of the panel and which are operative to force the fourth and remaining edge against an abutment locator pad. Such a scheme is disclosed in U.S. Pat. No. 4,255,077 issued to R. B. Smith, Mar. 10, 1981. In this arrangement, however, the reference axis is still related to one edge of the panel with the positioning of one edge of the panel against a fixed locator pad.

Another method of alignment of panels at a work station is disclosed by R. C. Colineau in U.S. Pat. No. 4,425,076 issued Jan. 10, 1984. In this arrangement two roller stops define a first axis, and a third roller stop defines an end point. A first pivot arm with a roller forces one edge of the panel against the first two roller stops, and then a second pivot arm with a roller forces the panel against the third roller stop. This arrangement locates the panel with respect to a reference frame origin located at one corner of the panel.

Yet another method of positioning and aligning panels is disclosed by J. J. Hodges in U.S. Pat. No. 4,092,783, issued June 6, 1978, which includes apparatus for engaging opposing corners of the panel with clamping devices with a controlled equidistant disposition of the clamps to both correctly orient and center the panel and securely clamp it in one operation. This orients the panel with respect to a central point and a diagonal line connecting diagonally opposite corners.

Because of dimensional changes that occur in circuit panels during manufacturing, it is desirable that the positional reference frame be a fixed point preferably at or near the center or centroid of the panel in order to minimize the effect of these dimensional changes in positioning the panel on a work surface. It is also desirable that the positioning operations and apparatus be operative to align one axis of the panel passing through the fixed point with a work surface reference axis line.

SUMMARY OF THE INVENTION

Therefore, a panel locating method, embodying the principles of the invention, is operative for locating a panel on a work surface so as to fix a point preferably at or near the panel center and an axis passing through that fixed point. The axis defined may be located anywhere on the panel. Frequently it is either at or near to a major or minor axis of the panel. A major axis of a rectangular panel parallels the larger dimension of the panel and passes through the fixed point while a minor axis parallels the shorter dimension and passes through the same fixed point.

A panel to be positioned on the work surface is prepared by providing tooling features in the panel such as holes positioned adjacent to opposite edges of the panel and being symmetrical with respect to its selected reference axis. An engaging mechanism, associated with the work surface, engages the tooling features with synchronized engaging elements applying opposing equidistant motion of the engaging elements to the tooling features in order to achieve the desired panel location.

A mechanical mechanism is associated with the work surface which is operative for symmetrically moving the engaging elements equidistantly in opposing directions with a trajectory parallel to a reference axis of alignment of the work surface. The engaging elements apply the requisite forces through the tooling features to position and hold the panel on the work surface. The motion of the engaging elements and these forces are operative in particular to position a fixed point of the panel and the selected axis of the panel passing through the fixed point in alignment and registration with a origin point and reference axis of the work surface. The engaging elements may be activated by any mechanism that can synchronously drive them in a symmetrical trajectory about the origin point of the work surface reference frame.

It is readily apparent that this panel positioning scheme advantageously positions a panel on a work surface so that its preselected fixed point and its selected axis therethrough is positioned in registration with a work surface reference origin and axis without the necessity of compensating adjustments for the panel deformations in the positioning scheme.

BRIEF DESCRIPTION OF THE DRAWINGS

An appreciation of the invention may be readily attained by reference to the following specification and the accompanying drawings in which.

DETAILED DESCRIPTION

Figure 3:
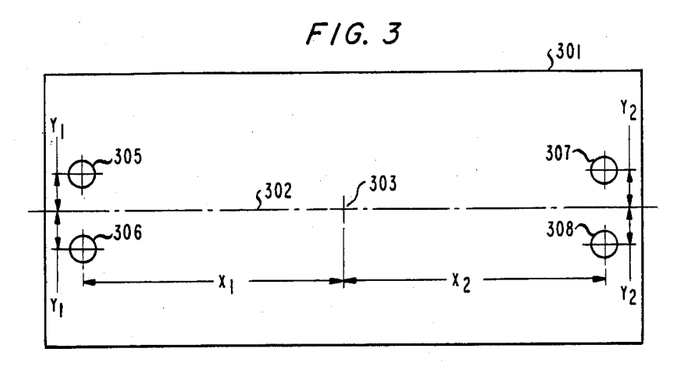
FIG. 3 is a plan view of a panel having two tooling feature pairs at opposite ends of the panel and located symmetrical with a major axis of the panel.

A panel which has been prepared with tooling features to facilitate its location on a work surface in registration with reference indicia of that surface is shown in plan view in FIG. 3. This panel 301 is shown having a rectangular shape, although it is to be understood that the shape of the perimeter of the panel may be any desired shape without departing from the scope of the invention. A selected axis 302 and desired fixed central or near central fixed point 303 is defined on the surface of the panel such that the axis 302 passes through the fixed point 303. While this axis 302 and fixed point 303 may reflect the true geometric center of the panel, it is to be understood that an axis and fixed point independent of the panel geometry may be selected as the control indicia. Tooling features shown illustratively as the holes 305, 306, 307 and 308 are machined into the panel 301 to facilitate a repeatable positioning of the panel on a work surface in register with reference indicia of the work surface.

The location of the four holes 305, 306, 307 and 308 defines the reference axis 302 and the fixed point 303. In particular a line passing through the centers of the holes 305 and 307 is at a normal distance $x_1$ from the fixed point 303. Similarly a line passing through the centers of the holes 306 and 308 is at a normal distance $x_2$ from the fixed point 303. The distance $x_1$ is equal to the distance $x_2$. The holes 305 and 306 are each at the distance $y_1$ from the axis 302 and the holes 307 and 308 are each at the distance $y_2$ from the axis 302. The distances $y_1$ and $y_2$ need not be equal as shown. It is sufficient that these holes, (i.e., tooling features) be mirror symmetrical with the axis 302.

Figure 4:
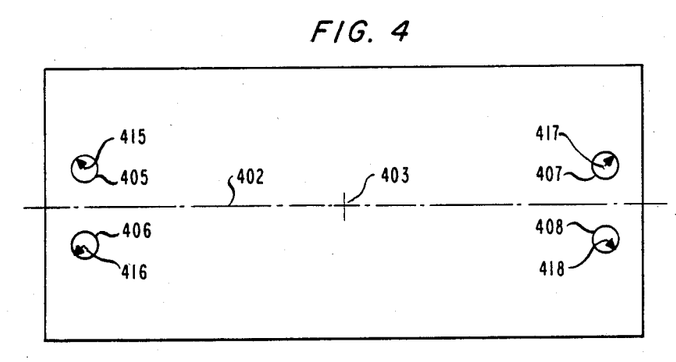
FIG. 4 is a fragmentary plan view of the tooling features of FIG. 3 showing one method of panel engagement to secure and locate the panel.
Figure 5:
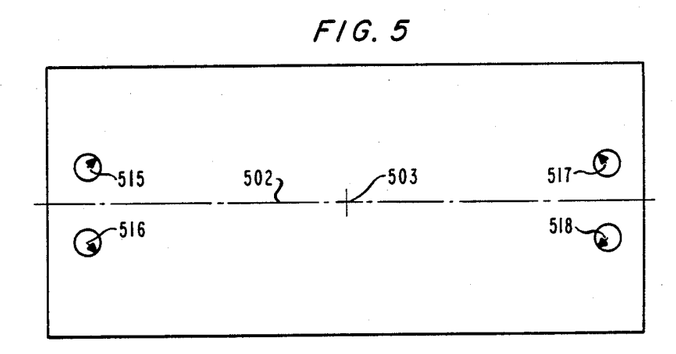
FIG. 5 is a fragmentary plan view of the tooling features of FIG. 3 showing another method of panel engagement to secure and locate the panel.

The panel in FIG. 4 is secured to the work surface by engaging the holes 405–408 at a localized limited area of contact depicted by the arrows 415, 416, 417 and 418. This localized area of contact ideally approaches a line contact with the cylindrical surface of the hole. The engaging elements making the contact are moved synchronously and equidistantly parallel to the reference axis 622 of the work surface (FIG. 6) and away from an origin point of the work surface until all four localized limited areas of contact are fully engaged. In FIG. 5 alternate localized areas of contact are shown by the arrows 515, 516, 517 and 518. Here the engagement elements are moved synchronously and equidistantly parallel to reference axis 622 (FIG. 6) and toward an origin point of the work surface. This arrangement is best utilized with fairly rigid panels capable of withstanding compressive gripping.

Figure 6:
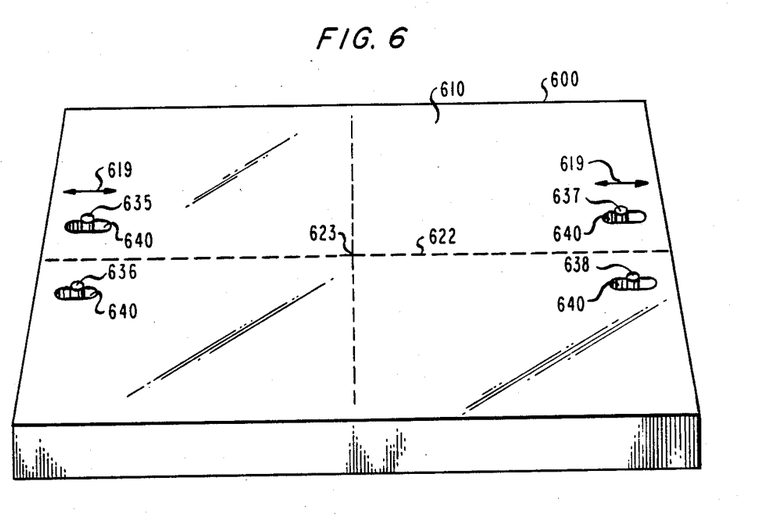
FIG. 6 is a perspective view of a work table including a work surface having a system embodying the principles of the invention for accepting and positioning panels thereon.

A typical work table 600 for accepting panels is shown in FIG. 6 and includes a planar work surface 610 for accepting a panel thereon, and force applicators embodied as pins or localized area contactors 635, 636, 639 and 638, which move along elongated slots 640, as shown by the arrows 619, to engage tooling feature holes of a panel such as shown in FIG. 3. The work table 600 may be mounted as part of a manufacturing machine which performs machine operations on a panel, and as such, has a reference coordinate system shown by centroid or origin point 623 and axis 622 determined by the manufacturing operational devices (i.e., drills, etc.) of that machine. While the surface 610 is shown unbroken, it is to be understood that apertures may be provided to permit the emergence of machine tools or light through the surface.

Figure 7:
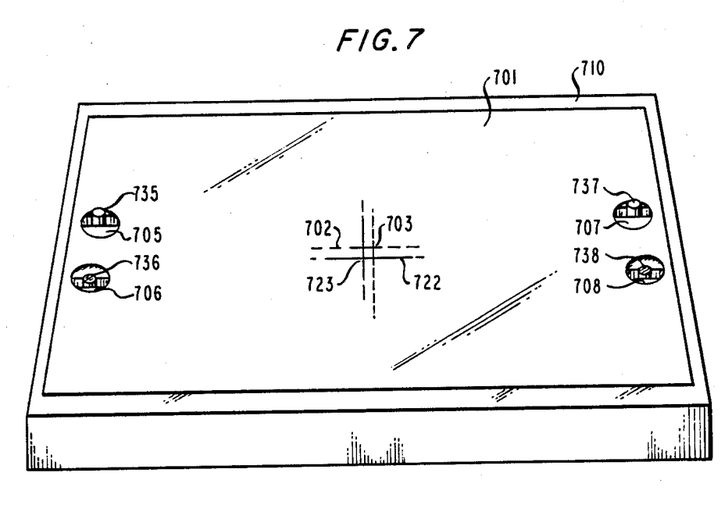
FIG. 7 is a perspective view of a work surface upon which a panel has been placed prior to its positioning for manufacturing operations.

A panel 701 is shown as initially placed on the work surface 710 in FIG. 7. As shown, its coordinate system comprises a central or near central fixed point 703 and a major axis 702, which is shown displaced from the reference coordinate system of the work surface, which comprises an origin point 723 and a reference axis 722. As shown in FIG. 7 the pin or localized area contactors 735–738 have not yet fully engaged the periphery of the tooling holes 705–708 in the panel 701 so as to firmly grip it and accurately position it.

Figure 8:
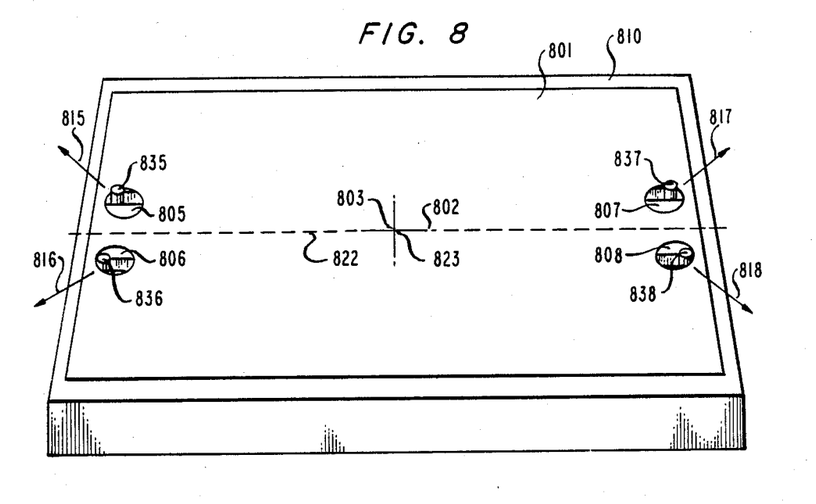
FIG. 8 is a perspective view of a work surface after the centering apparatus employing a method in accord with the invention has properly positioned the panel in register with the work surface coordinate system.

The panel 801, as shown in FIG. 8, is fully positioned and secured to the work surface; the periphery of the tooling feature holes 805–808 are forcibly engaged by the pin or localized area contactors 835–838, which have moved outwardly from the center or near center fixed point 823 along a line parallel to the axis 822 to grip the panel, to position it and also to firmly secure it to the work surface 810 by applying the resultant equilibrium forces as shown by arrows 815–818. The panel's center or near center fixed point 803 and axis 802 are now coincident with the reference center or origin and reference axis of the work surface.

Figure 9:
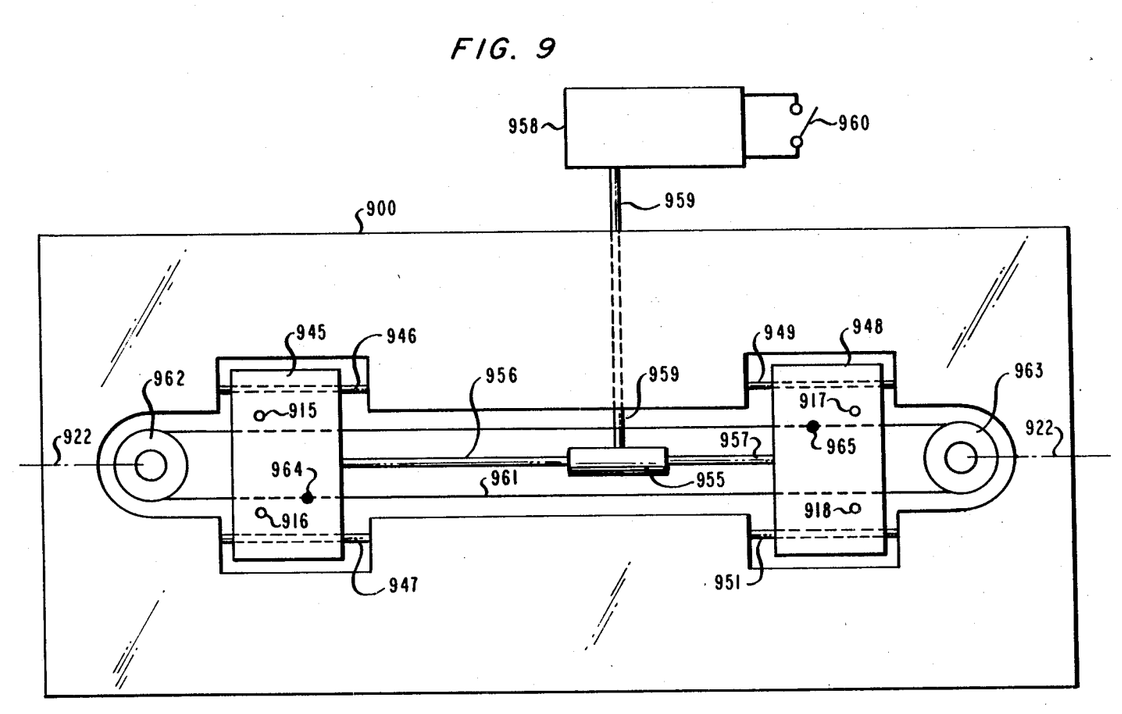
FIG. 9 is a cut away perspective of a centering mechanism to position and secure the panel on the work surface.

The pins which supply the positioning and securing forces may be mounted in a movable carriage support system such as shown in FIG. 9. As shown, the pins 915 and 916 are mounted on a carriage support 945 which rides on two tracks 946 and 947 located in the work table assembly. Pins 917 and 918 are mounted on a carriage support 948 which rides on two tracks 949 and 951 located in the work table assembly. The tracks 946, 947, 949 and 951 are all placed in a direction parallel to the reference axis so that the carriage support move only along the reference axis.

The carriage supports 945 and 948 are simultaneously moved in equidistant but opposing directions by a drive mechanism which as shown in the illustrative embodiment includes an air driven piston in a cylinder 955 which is connected to each carriage support 945 and 948 by the rods 956 and 957 respectively.

Upon actuation of the cylinder 955, movement of the piston pushes the two carriage support mechanisms 945 and 948 away from one another. The cylinder 955 is connected by tubing 959 to a control mechanism 958, which may be automatically or manually (switch 960) actuated.

A continuous cable 961 is looped around two pulley wheels 962 and 963 which are located at opposite ends of the work table 900. The two carriage support mechanisms 945 and 948 are connected to the cable loop 961 on the underside of the carriage mechanisms at points 964 and 965, respectively, on opposite sides of the reference axis 922 so that each carriage mechanism 945 and 948 is constrained to move in synchronism in opposite directions. The two carriage support mechanisms 945 and 948 move away from one another by equal increments of distance until the panel on the work surface is firmly secured in registration with the reference indicia of the work surface.

Figure 10:
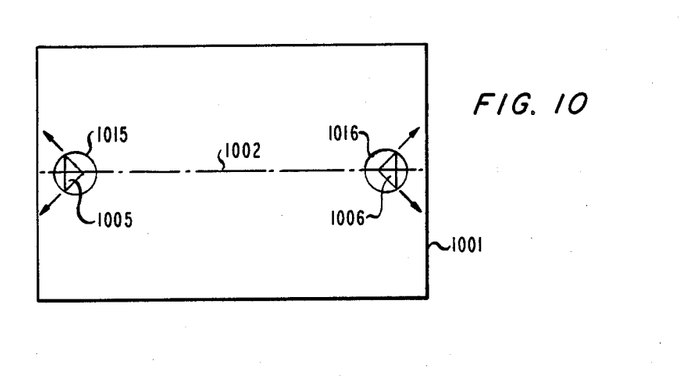
FIG. 10 is a plan view of a panel showing an alternative tooling arrangement.

An alternative embodiment of the panel locating technique is disclosed in FIG. 10 in which the panel tooling feature comprises a single hole 1015 and 1016 at opposite ends of the panel 1001. The center of each of these holes is coincident with and indeed determines the axis 1002 of the panel. The triangular shaped engagement elements 1005 and 1006 constrained to move equidistantly in opposite directions are used to engage the holes at four localized area contact locations in order to effect location of and securing of the panel to the work surface in registration with its reference indicia.

Figure 11:
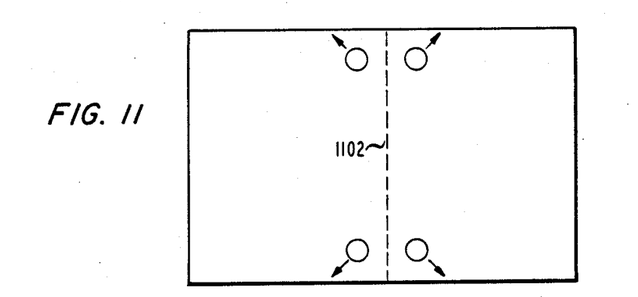
FIG. 11 is a plan view of a panel showing another alternative tooling feature arrangement.

Yet another alternative arrangement is shown in FIG. 11 in which the tooling features of the panel are positioned symmetrically with respect to a different axis 1102 of the panel (i.e., axis across the width of the panel rather than its length).

While a particular mechanism has been disclosed for achieving the desired localized area contact with the tooling features of the panel, it is to be understood that many other arrangements may be utilized by those skilled in the art without departing from the spirit and scope of the invention.

What is claimed is:

1. A method for positioning a panel on a work surface, with a fixed point and a selected axis of the panel passing through the fixed point being in register with an origin point and a reference axis passing through the origin point of the work surface, comprising the steps of:
preparing a panel to be positioned with tooling features within the periphery of the panel that permit engagement by localized area contact in at least four designated locations,
engaging the tooling features at the four designated locations with localized area contact engagement elements by moving the localized area contact engagement elements synchronously and equidistantly such that the motions of the four localized area contact engagement elements are symmetrical with respect to the origin point and the reference axis passing through the origin point.

2. A method for positioning a panel as defined in claim 1 wherein the step of preparing a panel with tooling features includes the step of providing holes in the panel as the tooling features.

3. A method for positioning a panel as defined in claim 2 wherein the step of providing holes includes the step of generating four holes located symmetrically with respect to the fixed point and axis of the panel.

4. A method for positioning a panel as defined in claim 2 wherein the step of providing holes includes the step of generating two holes centered with respect to the axis of the panel and symmetrical about the fixed point of the panel.

5. A method for positioning a panel as defined in claim 3 wherein the step of engaging the tooling features includes the step of engaging each of the four holes with four pins each applying force to a circumference of each of the holes.

6. A method for positioning a panel as defined in claim 4 wherein the step of engaging the tooling features includes the step of engaging each of the two holes with an engaging member that applies two separate localized area contact forces to each hole.

7. A method for positioning a panel as defined in claim 1 wherein the step of engaging the tooling features includes the step of directing the localized area contact engagement elements away from the fixed point of the panel.

8. A method for positioning a panel as defined in claim 1 wherein the step of engaging the tooling features includes the step of directing the localized area engagement elements toward the fixed point of the panel.

9. A method for positioning a panel on a work surface, with a fixed point of the panel and an axis of the panel passing through the fixed point of the panel being in register with an origin point of the work surface and a reference axis of the work surface passing through the origin point, comprising:
the step of providing features in the panel within the periphery of the panel permitting a localized area contact engagement at four distinct localized area contact locations,
the step of locating the features dimensionally symmetrical about the fixed point of the panel and the axis of the panel,
the step of moving four localized area contact engagement elements synchronously and equidistantly with respect to the origin point and the reference axis to engage the four distinct localized area contact locations, each localized area contact location being in a different orthogonal quadrant defined by orthogonal axes originating at the origin point and aligned with the reference axis.

10. A method for positioning a panel on a work surface as defined in claim 9 wherein the step of moving the four localized area contact engagement elements includes the step of directing individual engagement elements away from the fixed point of the panel.

11. A method for positioning a panel on a work surface as defined in claim 9 wherein the step of moving the four localized area contact engagement elements includes the step of directing individual localized area contact engagement elements toward the fixed point of the panel.

12. A method for positioning a panel on a work surface as defined in claim 9 wherein the step of moving four localized area contact engagement elements includes the step of directing the engagement elements to apply tensile forces to the panel.

13. A method for positioning a panel on a work surface as defined in claim 9 wherein the step of moving four localized area contact engagement elements includes the step of directing the engagement elements to apply compressive forces to the panel.

14. A method for positioning a panel on a work surface as defined in claim 9 wherein the step of providing features includes locating each of the four distinct localized area contact locations in a separate hole in the panel.

15. A method for positioning a panel on a work surface as defined in claim 9 wherein the step of providing features includes providing two holes and pairing the four distinct localized area locations with two locations to each hole provided in the panel.

16. A method for positioning a panel on a work surface such that a fixed point and an axis of the panel are in register with an origin point and reference axis of the work surface, comprising:
- the step of defining a fixed point and an axis passing through the fixed point of the panel,
- the step of providing panel aperture features on opposite sides of the fixed point and which are mirror symmetrical about the axis passing through the fixed point of the panel,
- the step of engaging the panel apertures at a single localized area associated with each panel aperture with localized area contact mechanisms which are moved symmetrically and equidistantly with respect to the origin point.

17. A method for positioning a panel on a work surface as defined in claim 16 wherein the step of engaging includes the step of moving the localized area contact mechanisms away from the origin point.

18. A method for positioning a panel on a work surface as defined in claim 16 wherein the step of engaging includes the step of moving the localized area contact mechanisms toward the origin point.

19. A method for positioning a panel on a work surface as defined in claim 16 wherein the step of providing panel aperture features includes the step of generating holes in the panel.

* * * * *

UNITED STATES PATENT AND TRADEMARK OFFICE
CERTIFICATE OF CORRECTION

PATENT NO. : 4,793,052
DATED : December 27, 1988
INVENTOR(S) : Hans H. Ammann; Richard F. Kovacs It is certified that error appears in the above—identified patent and that said Letters Patent is hereby corrected as shown below:

Assignee: On the title page

At [73], page 1, "AT&T Laboratories" should read --AT&T Bell Laboratories--.

Signed and Sealed this

Twenty-fourth Day of October, 1989

Attest:

DONALD J. QUIGG

Attesting Officer

Commissioner of Patents and Trademarks